United States Patent [19]

Zurcher

[11] 4,111,510
[45] Sep. 5, 1978

[54] FLEXIBLE CIRCUIT/FLAT CABLE TO CIRCUIT BOARD EDGE CONNECTOR FOR ELECTRONIC WRIST WATCHES, CALCULATORS AND THE LIKE

[75] Inventor: Rudolf F. Zurcher, Newport Beach, Calif.

[73] Assignee: Hughes Aircraft Company, Culver City, Calif.

[21] Appl. No.: 814,370

[22] Filed: Jul. 11, 1977

Related U.S. Application Data

[63] Continuation of Ser. No. 653,320, Jan. 29, 1976, abandoned.

[51] Int. Cl.² .............................................. H05K 1/12
[52] U.S. Cl. ........................... 339/17 F; 339/176 MF
[58] Field of Search ...................... 339/17 F, 176 MF

[56] References Cited

U.S. PATENT DOCUMENTS

| 3,602,870 | 8/1971 | Willard ............................ 339/17 F |
| 3,772,775 | 11/1973 | Bonnke et al. .............. 339/17 F UX |
| 3,829,817 | 8/1974 | Beavitt ..................... 339/176 MF X |
| 3,851,294 | 11/1974 | Palazzetti et al. ........ 339/176 MF X |

*Primary Examiner*—Roy Lake
*Assistant Examiner*—E. F. Desmond
*Attorney, Agent, or Firm*—Lewis B. Sternfels; W. H. MacAllister

[57] ABSTRACT

A generally C-shaped or Ω-shaped elongated clamp secures a flexible circuit or flat cable to the edge of a circuit board designed for use in electronic watches, calculators, combinations thereof and like small devices such as are wearable on the user's wrist.

11 Claims, 6 Drawing Figures

FLEXIBLE CIRCUIT/FLAT CABLE TO CIRCUIT BOARD EDGE CONNECTOR FOR ELECTRONIC WRIST WATCHES, CALCULATORS AND THE LIKE

This is a continuation of application Ser. No. 653,320, filed Jan 29, 1976, now abandoned.

BACKGROUND OF THE INVENTION

1. Field of the Invention

The present invention relates to flat cable/flexible circuit to circuit board connectors where the flat cable or flexible circuit itself is the electrical connection media and local thickness variation equalizer and, more particularly, to such connectors specifically adapted for use in electronic devices wearable on the user's wrist, such as electronic watches, calculators and watch-calculator combinations.

2. Description of the Prior Art

There has been required, especially in extremely small electronic devices, such as electronic watches, calculators and the combination thereof, the need to make simple, small, and inexpensive connections. The electrical integrity of the connection must be maintained. Furthermore, these connections must be easily and repeatably connected and disconnected so that the components connected may be replaced and/or repaired in a non-destructive manner. While there has been numerous devices utilized for much larger devices, they have not been entirely successful when applied to miniaturized electronic devices, and are further wasteful of space. Examples of such prior art devices include those described in U.S. Pat. Nos. 2,825,042; 3,082,398; 3,102,767; 3,114,587; 3,158,421; 3,319,216; 3,401,369; 3,461,221; 3,488,620; 3,492,538; 3,533,049; 3,602,870; 3,614,707; 3,629,787; 3,772,775; 3,774,075; and 3,845,236. While all these prior art devices appear to work well or at least satisfactorily for their intended purposes or in their specialized environments, they do not meet the specific requirements described above and embraced by the objects set forth below.

One primary deficiency of the prior art, which is believed to be fairly represented by the above noted patents, is its total disregard of space limitations. Electronic devices, which are intended for wear on a user's wrist or, perhaps, attached by a pin or clasp to one's clothes or hung by a chain from the wearer's neck must, of necessity, be sufficiently small in size not only to be wearable but also to be aesthetically attractive, without detracting from the usefulness or quality of the device. As a consequence, a multitude of components must be crowded into the smallest possible space. While it is possible to permanently electrically couple all the components together by bonding or related methods, repair and replacement of the components became inconvenient, if not impossible, due to the relative ease of destruction by heat or breakage. The prior art relating to electrical connections which may be easily made and disconnected in such a small environment has not recognized, or if recognized, not solved these problems. As a consequence, many prior art connectors utilize a multiplicity of parts, such as exemplified in at least several of the above noted patents.

Also, as a result of the smallness of the connections to be made, it is not possible to use separate spring engaging means, e.g., U.S. Pats. Nos. 2,825,042; 3,082,398; 3,102,767; 3,158,421; 3,461,221; 3,492,538; 3,614,707; and 3,629,787 for the primary reasons that there is insufficient material in the separate tines to maintain proper electrical contact and that the smallness required would result in too great a fragility of the tines. This problem would be less likely to occur if a single length of clamp were utilized; however, then any planar discontinuities may preclude proper pressure between each and every contact-engaging surface. This problem may have been partially the reason for the use of a flexible dielectric sheet in U.S. Pat. 3,401,369, although it must be acknowledged that this patent does not present or discuss this problem. The deficiency of the solution (based upon an assumption that such indeed was an intent in U.S. Pat. No. 3,401,369) is that an additional flexible dielectric sheet bonded to a spring backing is required and entails the use of precious space which is otherwise need either for other components or for lesser device thickness in electronic watches and calculators.

U.S. Pat. No. 3,772,775 is likewise deficient in that, while it is directed to coupling a flat conductor cable to a circuit board, there is no concern as to space requirements in that special enclosures are needed. Furthermore, there is no disclosure whether a single clamping surface of a plurality of tines are used, leading one to believe that there also was no consideration given to the special problems in electronic watches and calculators.

SUMMARY OF THE INVENTION

The present invention overcomes these and other problems by utilizing a substantially ridged, elongated clamp of resilient material having a generally $\Omega$-shaped or C-shaped cross-sectional configuration which is capable of bending flexible circuitry, such as flat cable and flexible circuits, around the termination edge of a circuit board or the like so that the respective bared conductive materials of the flexible circuitry and the termination can be brought in electrical contact and be mechanically clamped together.

More particularly, the spring clip is of simple construction having single straight line pressure jaws for bringing a plurality of conducting paths into close mechanical pressure and electrical contact without the requirement for adding pressure or height adjusting compensating media such as rubber or conductive elastomers. The plastic film of the flexible circuit itself serves as the sole local thickness variation equalizer. All that is needed is for one to design for high specific contact pressure of the narrow leads on the contact section of the flexible circuit combined with sufficient contact spring clip force.

The clips may be designed to have a flat side for conservation of space, and opposed clips may further be used to center and support the circuit board with a watch or calculator casing secure from electrical and mechanical damage to it or surrounding components.

It is, therefore, an object of the present invention to provide for a simple connecting device having basically three parts, regardless of the number of individual electrical couplings be made, specified for use in such small enclosures as electronic watches, calculators and watch-calculator combinations which are wearable on user's person.

Another object is to enable repeatable connection and disconnection of electrical components for repair and interchangeability of components in such small enclosures.

Another object is to provide for minimum size of connection so as to obtain maximized miniaturization of components and for narrow lead length in such small enclosures.

Another object is to provide for a closed clamping force system which is independent of external counter-holding force structures.

Another object is to provide for a nondestructive clamping system which exerts mostly compressive stresses.

Another object is to provide for a low mass connector system, applicable especially for free floating of supported structures and freedom of design.

Another object is to provide for protection of connected devices, especially of or from sharp-edged ceramic substrates.

Another object is to provide for shock absorption and locator stops for electronics devices.

Another object is to provide for ease and allowance of high density packaging in small electronic devices.

Another object is to provide for a connection system which requires no special preparatory manufacturing steps beyond normal fabrication of flexible circuits and cables.

Another object is to avoid the requirement for matching or aligning of external and individual pressure contact fingers.

Other aims and objects as well as a more complete understanding of the present invention will appear from the following explanation of exemplary embodiments and the accompanying drawings thereof.

DESCRIPTION OF THE PREFERRED EMBODIMENT

Figure 1:
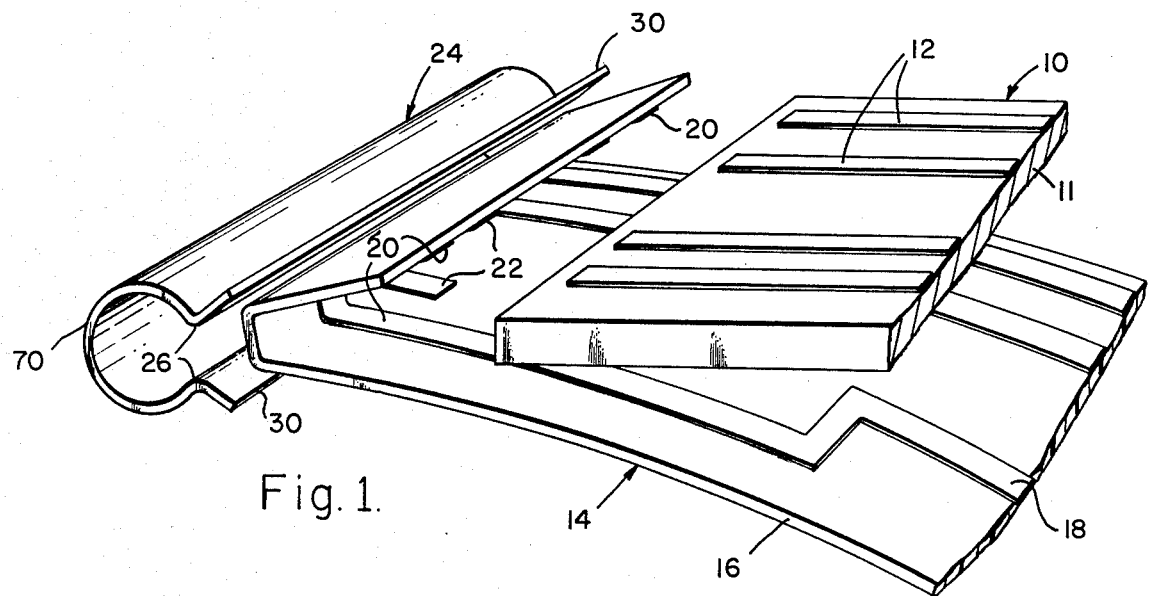
FIG. 1 is a view of the present invention prior to coupling two components together.
Figure 2:
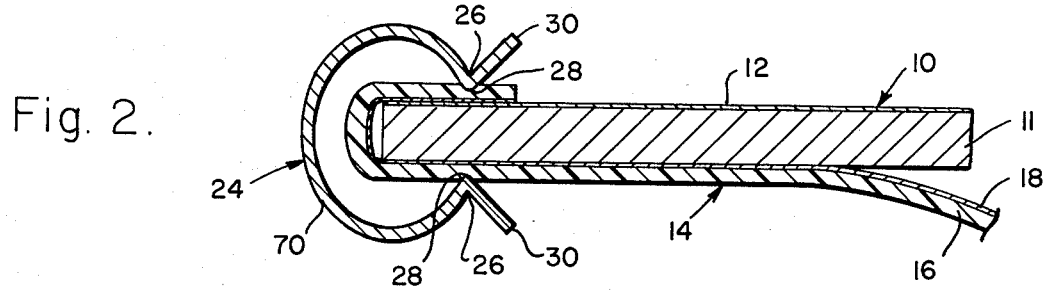
FIG. 2 is a cross-sectional view of a system coupled together.

As shown in FIGS. 1 and 2, a circuit board 10 or other electronic components for use in such small electronic devices as wrist watches and wrist watch-calculator combinations terminates in a stiffened termination with one or more bared or exposed conductive leads 12 placed on at least one surface of the circuit board. These terminal leads 12 may have been placed on the circuit board in any convenient manner (e.g., etching) as is well known in the art. Other similar leads 12 may be placed on the bottom side of circuit board 10 where sufficient space for such leads does not exist on its upper surface.

Flexible electric circuitry 14, such as flat electric cable or an active flexible circuit, is adapted to be electrically and mechanically coupled to circuit board 10 and its conductors 12. One example of flexible circuitry comprises a flat electric cable which may be formed by any conventional process, such as by etching, collating, extruding, and fusing together of individual insulated wires. Alternatively, it may comprise an active flexible circuit formed by etching and/or other operations. In any case, circuitry 14 is flexible and comprises a dielectric material 16 having conductors 18 therein or thereon which are bared at their extremities 20. Conductors 18 may be round or flat or of any other convenient cross-sectional configuration. If it is desired, special short conductors 22 may be formed to join any conductors 12 on circuit board 10 on both sides thereof. For this reason, conductor 22 of flexible electrical circuitry 14 shown to comprise a short segment. It is to be understood, however, that conductors 18 may be bared so as to form connections at both the upper and lower levels with conductors on a circuit board 10 if such electric coupling is desired.

Regardless of the particular configurations given, electrical and mechanical securement between flexible circuitry 14 and circuit board 10 is effected by a spring clip 24 having a general cross-sectional C-shaped or Ω-shaped configuration. Clip or clamp 24 is formed of a substantially rigid material of either metal or plastic. The preferred metal, for example, is beryllium copper. Because it is adapted to make contact with insulation 16 of flexible circuitry 14, clip 24 may be of an electrically conductive material. Therefore, its construction is not limited by electrical conductance considerations, but solely by mechanical considerations. If desired, however, clip 24 may be used as a grounding mechanism from one or more conductors 12 and 18 and, of course in this use, the spring clip must be constructed from an electrical current-carrying material.

Spring clip 24 is further of resilient material and is provided with a single pair of opposing jaws 26 so as to provide straight line pressure without the need to add pressure or height compensating media such as rubber or conductive elastomers. The plastic film of flexible circuitry 14 itself serves as the sole local thickness variation equalizer and, as shown by indicium 28, is slightly compressed at the points of contact with jaws 26. The thickness and, therefore, amount of compression or squeezing of plastic film 16 varies with the existence or absence of conductors 12, 18, and 22 and other media or surface irregularities between the jaws and board 10. Therefore, the only design need is for high specific contact pressure.

Spring clip 24 of FIGS. 1 and 2 is shown in a preferred configuration having a pair of oppositely and outwardly extending terminal flanges 30 which act as an insertion mouth for facilitating manipulation of the clip over circuitry 14 and the stiff termination portion of board 10. This configuration is suited for pressing the clip frontally onto the circuitry and the board.

Figures 3, 4, 5:
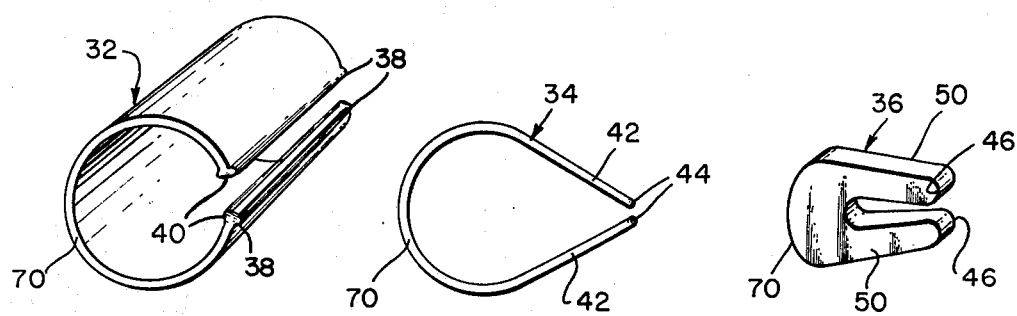
FIGS. 3–5 depict modifications of the embodiment depicted in FIGS. 1 and 2.

However, as illustrated in FIGS. 3–5, the spring clip although elongated as shown in FIG. 1, may have other cross-sectional configurations embodied as a variety of illustrative designs 32, 34 and 36. In FIG. 3, design 32 comprises a circular clip which lacks the oppositely extending flanges 30, but has rounded bar terminae 38. At its extreme sides, clip 32 may be bevelled at 40 to enable the clip to be engaged with circuitry 14 and board 10 in an edgewise sliding manner, as distinguished from the frontal insertion use of the FIGS. 1 and 2 embodiment.

Clip 34 of FIG. 4 illustrates still another modification in which terminal flanges 42 are substantially flat and converge at terminae 44. Clip 36 of FIG. 5 is similar to that of FIG. 4 but illustrates increased thickness 46 of its terminal flanges 50, particularly required when the clip is made of a plastic material.

Regardless of their particular design, clips 32, 34 and 36 all are intended to press into and deform insulation 16 in the same manner as illustrated for clip 24 of FIGS. 1 and 2.

Figure 6:
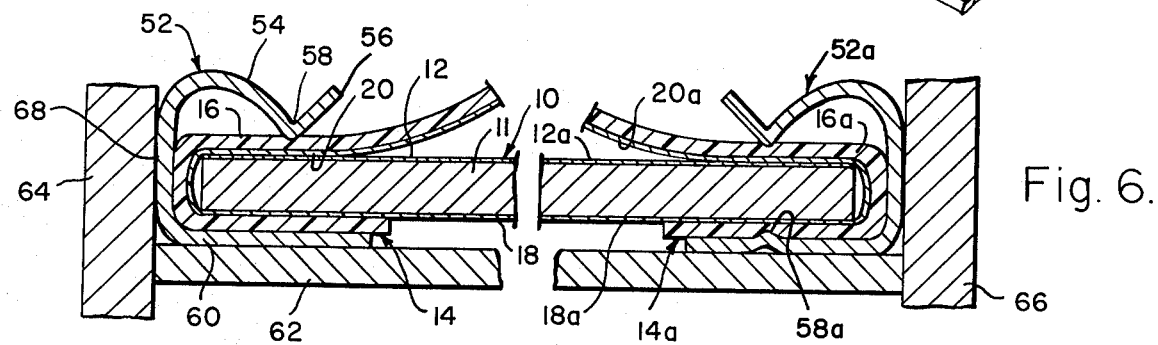
FIG. 6 illustrates further embodiments and uses of the present invention.

Still another embodiment of the present invention is depicted in FIG. 6. Here, spring clip 52, while incorporating the elongated configuration of clip 24 of FIG. 1 as well as similar curved portion 54 terminating in a flange 56 to define one elongated jaw 58, is modified to define a flattened portion 60 which extends substantially flat and contiguous with separate circuitry 16 and 16a and board 10. This embodiment is particularly important for very small electronic devices, such as watches and calculators and combinations thereof, adapted to be worn, for example, on the wearer's wrist. Because of space requirements, especially for the purpose of obtaining the flattest and smallest possible and more aesthetic design of a wristwatch, for example, the extra curved portion of FIG. 1, corresponding to curved portion 54 of FIG. 6, cannot be tolerated and, therefore, is replaced by flattened portion 60. Portion 60 then permits board 10 to rest directly upon a support or supports 62, which may also comprise one or more other electronic components.

This design shown in FIG. 6 is also particularly amenable to electrical couplings which are made only at the upper surfaces of board 10 respectively between leads 12 and 20 and between leads 12a and 20a, by virtue of the equalizing pressing in of separate jaws 58 on their respective insulation 16 and 16a. When electrical couplings must also be made at the bottom surface of board 10 by flattened portion 60, such coupling may not be quite as efficient as that obtained by jaws 58; however, the combination of a jaw 58 with a flattened portion will provide sufficient pressure for an adequate electrical coupling between the flat surfaces. If space limitations permit, a slight elongated continuous bead 58a may be formed in portion 60 of clip 52a for use as a stress raiser, should additional confidence be desired.

FIG. 6 is also intended to illustrate a further feature of the present invention where it is necessary to precisely center board 10 between two supports 64 and 66 and/or to protect the board from shock. For the centering purposes as well as for space conservation, clip 52 is provided with a further flat portion 68 connecting portions 54 and 60 for abutting against supports 64 and 66. It is to be understood, of course, that the configurations of FIGS. 1-5 are equally as useful for both precision centering and/or shock mounting of board 10. The C-shaped configurations of FIGS. 1-4 possibly afford the best shock mounting functions in the general arrangement of FIG. 6 due to the completely curved design which provides the least contact of the board with its surrounding environment which enable the board to pivot with a limited motion with respect to the spring clips and/or supports 64 and 66 in the space provided by additional curvature of the spring clips at portions 70.

Although the invention has been described with reference to particular embodiments thereof, it should be realized that various changes and modifications may be made therein without departing from the spirit and scope of the invention.

What is claimed is:

1. An electrical coupling mechanism for use in electronic devices including watches, calculators, combinations thereof, and the like, adapted for wear on a wearer's person comprising a stiff electrical termination, flexible electric circuitry adapted to be coupled thereto, and including elastomeric dielectric insulation, each said termination and said circuitry having bared conductive material thereon, a substantially rigid elongated clip of resilient material having a generally C-shaped cross-sectional configuration and including means for guiding said flexible circuitry around the termination, for bringing the respective bared conductive materials of the flexible circuitry and the termination into electrical contact, for exerting substantially straight-line pressure on said electric circuitry and thereby for mechanically clamping the flexible circuitry and the termination together, said elastomeric dielectric insulation serving as a local equalizer of any thickness variations between said electric circuitry and said termination, and bevelled sides on said clip for acting at least as said guiding means and for enabling said clip to be engaged with said circuitry and said stiff termination in an edgewise sliding manner.

2. The combination of claim 1 wherein said clip is of metal or plastic.

3. The combination of claim 2 wherein said flexible circuitry comprises flat electric cable.

4. The combination of claim 2 wherein said flexible circuitry comprises an active flexible circuit.

5. The combination of claim 1 wherein said means for exerting substantially straight-line pressure on said electric circuitry comprises at least one jaw pressing linearly on said dielectric insulation.

6. The combination of claim 5 wherein said clip comprises, in cross-section, a first flat portion in contact with said circuitry, a second flat portion extending substantially at a right angle from said first portion, a curved portion extending from said second flat portion and curving into contact with said circuitry for forming said jaw, and a terminal flange extending outwardly from said jaw and away from said circuitry.

7. The combination of claim 6 wherein said first flat portion includes a continuous bead substantially parallel to said jaw for effecting a stress raiser.

8. The combination of claim 1 wherein said clip includes a substantially circular body.

9. The combination of claim 8 wherein said clip circular body terminates in a pair of jaws each pressing linearly on said dielectric insulation.

10. The combination of claim 9 wherein said jaws terminate in a pair of oppositely and outwardly extending terminal flanges for acting at least as said guiding means and for facilitating frontal manipulation of said clip over said circuitry and said stiff termination.

11. A mechanism as in claim 1, wherein said stiff termination comprises a circuit board, and said support means comprises at least a pair of spaced supports, with said clip being at one edge thereof, and further including a second C-shaped clip secured to said circuit board at the opposing edge thereof, said clips being resiliently engaged between said spaced supports and said circuit board for centering as well as the shock mounting of said circuit board.

* * * * *